(12) United States Patent
Chen et al.

(10) Patent No.: US 10,756,438 B2
(45) Date of Patent: Aug. 25, 2020

(54) ELECTRONIC PACKAGE AND METHOD FOR FABRICATING THE SAME

(71) Applicant: Siliconware Precision Industries Co., Ltd., Taichung (TW)

(72) Inventors: Han-Hung Chen, Taichung (TW); Chun-Yi Huang, Taichung (TW); Chang-Fu Lin, Taichung (TW); Rung-Jeng Lin, Taichung (TW); Kuo-Hua Yu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 35 days.

(21) Appl. No.: 15/993,243

(22) Filed: May 30, 2018

(65) Prior Publication Data
US 2019/0273321 A1    Sep. 5, 2019

(30) Foreign Application Priority Data
Mar. 1, 2018   (TW) .............................. 107106804 A

(51) Int. Cl.
| H01Q 9/04 | (2006.01) |
| H01Q 1/22 | (2006.01) |
| H05K 1/14 | (2006.01) |
| H05K 1/18 | (2006.01) |
| H05K 1/11 | (2006.01) |
| H05K 1/02 | (2006.01) |
| H05K 3/36 | (2006.01) |

(52) U.S. Cl.
CPC ......... *H01Q 9/0414* (2013.01); *H01Q 1/2283* (2013.01); *H05K 1/0243* (2013.01); *H05K 1/112* (2013.01); *H05K 1/144* (2013.01); *H05K 1/181* (2013.01); *H05K 3/368* (2013.01); *H05K 2201/042* (2013.01); *H05K 2201/10098* (2013.01); *H05K 2201/10674* (2013.01); *H05K 2201/10734* (2013.01)

(58) Field of Classification Search
CPC ....... H01Q 1/2283; H01Q 9/04; H01Q 9/0414
See application file for complete search history.

(56) References Cited

U.S. PATENT DOCUMENTS

| 6,118,406 A   | * | 9/2000  | Josypenko | ............... | H01Q 1/38 |
|               |   |         |           |                 | 343/700 MS |
| 6,639,558 B2  | * | 10/2003 | Kellerman | ........... | H01Q 9/0414 |
|               |   |         |           |                 | 343/700 MS |
| 2009/0289852 A1 | * | 11/2009 | Li | ........................ | H01Q 1/3291 |
|               |   |         |           |                 | 343/700 MS |

* cited by examiner

*Primary Examiner* — Hoang V Nguyen
(74) *Attorney, Agent, or Firm* — Mintz Levin Cohn Ferris Glovsky and Popeo, P.C.; Peter F. Corless; Steven M. Jensen

(57) ABSTRACT

An electronic package and a method for fabricating the same are provided. A resist layer and a support are formed on a first substrate having a first antenna installation area. A second substrate having a second antenna installation area is laminated on the resist layer and the support. The resist layer is then removed. The support keeps the first substrate apart from the second substrate at a distance to ensure that the antenna transmission between the first antenna installation area and the second antenna installation area can function normally.

7 Claims, 6 Drawing Sheets

ELECTRONIC PACKAGE AND METHOD FOR FABRICATING THE SAME

CROSS-REFERENCE TO RELATED APPLICATION

This Application claims priority under 35 U.S.C. § 119(a) the benefit of Taiwanese Patent Application 107106804 filed on Mar. 1, 2018, the entire contents of which is incorporated herein by reference in its entirety.

BACKGROUND

1. Technical Field

The present disclosure relates to electronic packages, and, more particularly, to an electronic package with an antenna structure and a method for fabricating the same.

2. Description of Related Art

Current wireless communication technology has been widely used in a myriad of consumer electronic products (such as mobile phones, tablet PCs, etc.) to enable the reception and transmission of various kinds of wireless signals. In order to satisfy the need for ease of carrying and internet access (for example, viewing multimedia content) of the consumer electronic products, the manufacturing of wireless communication modules are designed with compactness and lightweight in mind. Among which, patch antennae are often used in the wireless communication modules of electronic products owing to their small size, light weight and ease of manufacturing.

Multimedia content these days often have very large file sizes as a result of the improved quality, so the bandwidths for wireless transmission have also increased, resulting in the advent of $5^{th}$ generation wireless transmission (5G). Since the transmission frequencies for 5G are higher, the requirements for the dimensions of their associated wireless communication modules have also been raised accordingly.

As shown in FIG. 1, a cross-sectional schematic diagram depicting a conventional wireless communication module 1 is shown. The wireless communication module 1 includes an antenna board 12 with an antenna structure (not shown) stacked on a circuit board 11 with a semiconductor chip 10 via a plurality of solder bumps 13. The circuit board 11 includes a ground plate (not shown), antenna feed lines (not shown), and a plurality of solder balls 15 disposed underneath the circuit board 11. A specific area is designated between the circuit board 11 and the antenna board 12 as an antenna active area A (that is, the area surrounded by the solder bumps 13 in which no gel or molding filler are allowed), and the distance L between the circuit board 11 and the antenna board 12 needs to be controlled to ensure the quality of transmission/receiving between the antenna structure of the antenna board 12 and the semiconductor chip 10. If the distance L does not satisfy the required height, then antenna signals cannot be reliably transmitted between the circuit board 11 and the antenna board 12.

Moreover, in the wireless communication module 1 the antenna board 12 is stacked on the circuit board 11 via the solder bumps 13. However, the solder bumps 13 may have large variations in their volumes and heights after reflow, and the grid array formed by these solder bumps 13 tends to have poor co-planarity, causing unbalanced contact stress and leading to a tilted antenna board 12 on top of the circuit board 11. This means that the distance L between the circuit board 11 and the antenna board 12 varies from one side to the other (e.g., one side is larger than the other). As a result, the antenna board 12 may not function properly, thereby lowering the product yield.

Therefore, there is a need for a solution that addresses the aforementioned issues in the prior art.

SUMMARY

In view of the aforementioned shortcomings of the prior art, the present disclosure provides an electronic package, which may comprise: a first substrate including a first antenna installation area; a support provided on the first substrate; a second substrate laminated on the support and stacked on the first substrate via the support, such that a distance between the first substrate and the second substrate is controlled, wherein the second substrate includes a second antenna installation area corresponding to the first antenna installation area.

The present disclosure further provides a method for fabricating an electronic package, which may comprise: forming a resist layer including at least one opening on a first substrate including a first antenna installation area, with a portion of the first substrate being exposed from the opening; forming in the opening a support in contact with the first substrate; laminating on the resist layer a second substrate in contact with the support, wherein the second substrate includes a second antenna installation area corresponding to the first antenna installation area; and removing the resist layer, such that the second substrate is stacked on the first substrate via the support.

In an embodiment, the resist layer is made of an etchable material.

In an embodiment, the first antenna installation area is exposed from the opening.

In an embodiment, an antenna active area is formed between the first antenna installation area and the second antenna installation area. In another embodiment, the antenna active area is an empty space.

In an embodiment, the support is made of a conductive material or an insulating material.

In an embodiment, the support is free from being electrically connected with the first antenna installation area and/or the second antenna installation area.

In an embodiment, the support is free from being electrically connected with the first substrate and/or the second substrate.

In an embodiment, the support is electrically connected with the first substrate and/or the second substrate.

In an embodiment, a covering material is formed on the support.

In an embodiment, an electronic component is provided on the first substrate. In another embodiment, the electronic component is located between the first substrate and the second substrate.

As can be understood from the above, the electronic package and the method for fabricating the electronic package according to the present disclosure control the distance between the first substrate and the second substrate by laminating the second substrate on the resist layer and the support, such that the second substrate is stacked on the first substrate via the support without the need for soldering materials while keeping the distance between the first substrate and the second substrate substantially constant. Therefore, compared to the prior art, the electronic package according to the present disclosure ensures proper antenna transmission by eliminating large variations in the distance between the first and second substrates, thereby ensuring a satisfactory product yield.

BRIEF DESCRIPTION OF THE DRAWINGS

FIG. 2C' is an alternative aspect of FIG. 2C;
FIG. 2D' is an alternative aspect of FIG. 2D;
FIG. 2E' is an alternative aspect of FIG. 2E.

DETAILED DESCRIPTION OF THE EMBODIMENTS

Figure 1:
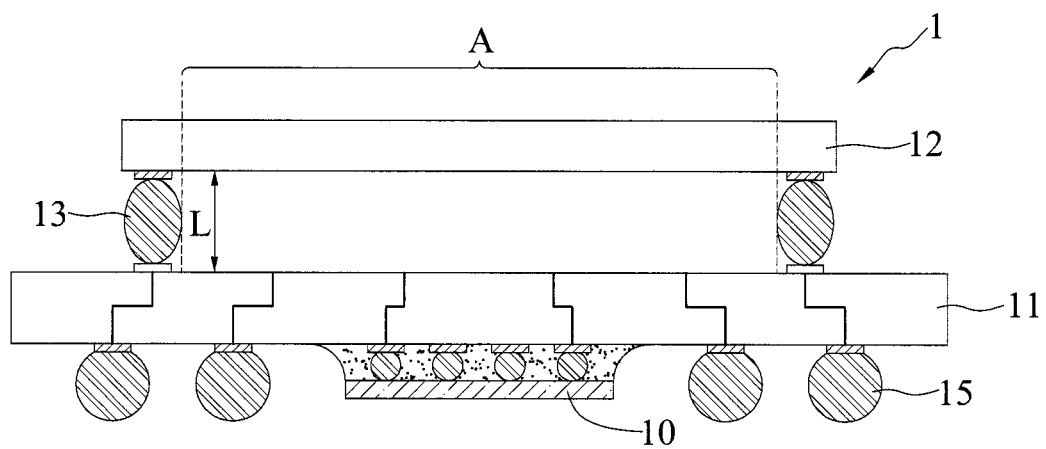
FIG. 1 is a cross-sectional schematic diagram depicting a conventional wireless communication module.

The technical content of present disclosure is described using the following specific embodiments. One of ordinary skill in the art can readily appreciate the advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2E are cross-sectional schematic diagrams depicting a method for fabricating an electronic package 2 in accordance with a first embodiment of the present disclosure.

Figure 2A:
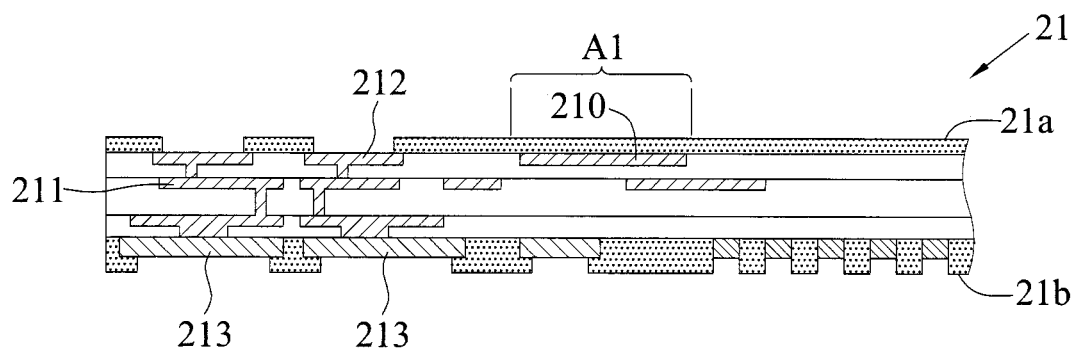
FIGS. 2A to 2E are cross-sectional schematic diagrams depicting a method for fabricating an electronic package in accordance with a first embodiment of the present disclosure.

As shown in FIG. 2A, a first substrate 21 with a first surface 21a and a second surface 21b opposite to the first surface 21a is provided.

In an embodiment, the first substrate 21 is a circuit board defined with the first surface 21a and the second surface 21b opposite to the first surface 21a. A first antenna installation area A1 defined on the first surface 21a is provided with a first antenna structure 210. The first substrate 21 further includes a first circuit layer 211. In an embodiment, the first antenna structure 210 is a wire antenna that can be optionally electrically connected with or insulated from the first circuit layer 211. The first circuit layer 211 includes at least one first electrical contact 212 and a plurality of ball pads 213. It can be appreciated that the first substrate 21 may also be other types of carrier for carrying chip(s), and the present disclosure is not limited as such.

Figure 2B:
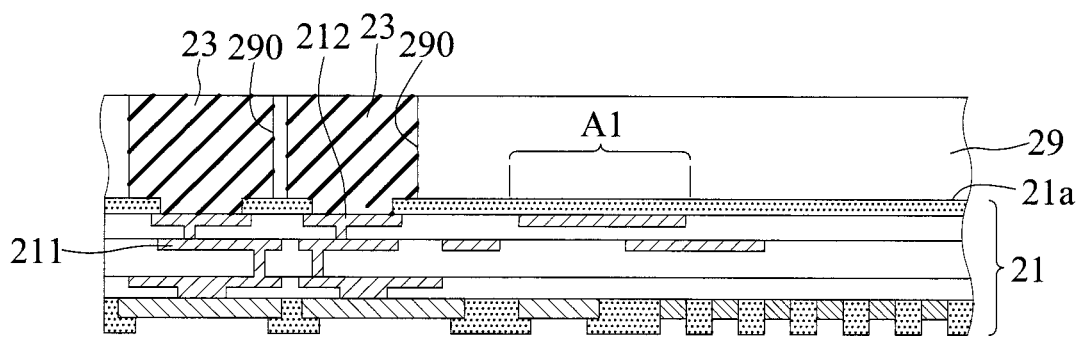

As shown in FIG. 2B, a resist layer 29 is formed on the first surface 21a of the first substrate 21. The resist layer 29 includes a plurality of openings 290 that expose a portion of the first substrate 21, and supports 23 are formed in the openings 290, so that the supports 23 are in direct contact with the first substrate 21.

In an embodiment, the resist layer 29 is made of an etchable material, such as an insulating material or a metal material (e.g., nickel and copper), and is laminated onto the first substrate 21. The first antenna installation area A1 is not exposed from the openings 290.

In an embodiment, the supports 23 can be made of a conductive material, an insulating material, or a combination thereof. In an embodiment, the supports 23 are copper or nickel conductive pillars bonded to the first electrical contacts 212 to be electrically connected with the first substrate 21, such that the first substrate 21 and the supports 23 are joined together in a metal-to-metal bonding method. In another embodiment, as shown in FIG. 2E', supports 24 are insulating pillars bonded to the first surface 21a of the first substrate 21 without electrically connected with the first substrate 21, such that the first substrate 21 and the supports 23 are joined together in an insulating material-to-insulating material bonding method. In other words, the bonding between the substrate and the supports can be a lamination method found in a substrate manufacturing process, a metal-to-metal bonding, or an insulating material-to-insulating material bonding method, but the present disclosure is not limited to these. In yet another embodiment, the supports 23 and 24 can be conductive cores coated with an insulating material, or insulating cores coated with a conductive material.

It can be appreciated that even if the supports 23 are conductive pillars, it is possible that they may not be electrically connected with the first substrate 21. In other words, the supports 23 are merely used as supports, and are not electrically connected to the first substrate 21. In an embodiment, the first electrical contact 212 may be dummy pads with no electrical function, so that the supports 23 are not electrically connected with the first circuit layer 211.

In an embodiment, the resist layer 29 can be made of a material different from that of the supports 23, 24. In another embodiment, the resist layer 29 is made of a first metal material, such as nickel, and the supports 23 are made of a second metal material, such as copper. In yet another embodiment, the resist layer 29 is made of a first metal material, such as copper, and the supports 23 are made of a second metal material, such as nickel.

Figure 2C:
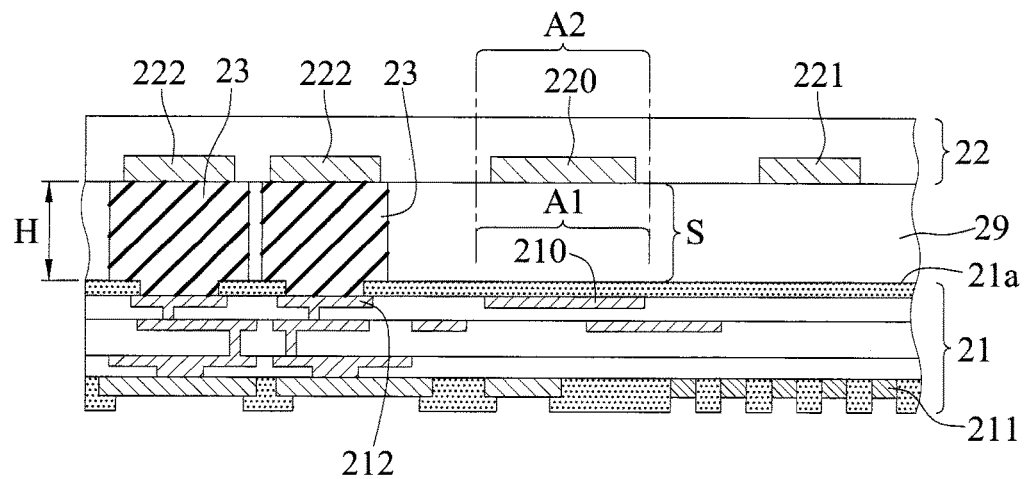
Figure 2C:
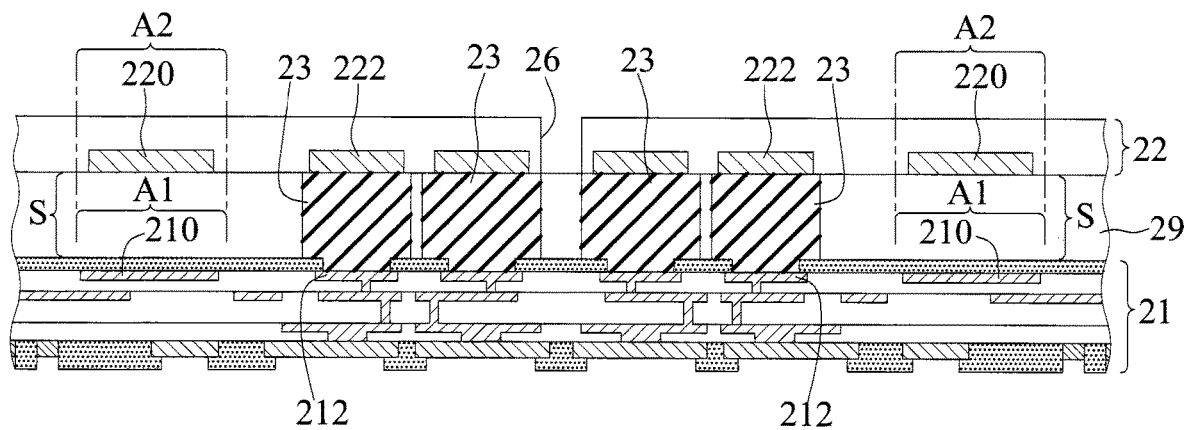

As shown in FIG. 2C, a second substrate 22 is laminated on the resist layer 29, and the second substrate 22 is allowed to be in direct contact with the supports 23.

In an embodiment, the second substrate 22 is an antenna board defined with a second antenna installation area A2 corresponding to the first antenna installation area A1, such that an area between the first antenna installation area A1 and the second antenna installation area A2 is used as an antenna active area S. A second antenna structure 220 is provided in the second antenna installation area A2. The second substrate 22 further includes a second circuit layer 221. The second antenna structure 220 is a wire antenna that can be selectively electrically connected with or insulated from the second circuit layer 221. The second circuit layer 221 includes at least one second electrical contact 222. It can be appreciated that the second substrate 22 may also be other types of antenna boards, and the present disclosure is not limited as such.

In an embodiment, the supports 23 are directly bonded between the first electrical contacts 212 and the second electrical contacts 222 to electrically connecting the first substrate 21 and the second substrate 22. In another embodiment, the second electrical contacts 222 are dummy pads with no electrical function, so that the supports 23 are not electrically connected with the second circuit layer 221.

In an embodiment, the second antenna structure 220 is inductively coupled with the first antenna structure 210, and signals are transmitted between the first antenna installation area A1 and the second antenna installation area A2.

In another embodiment, the first electrical contacts 212 or the second electrical contacts 222 are dummy pads with no electrical function, so that the supports 23 are not electrically connected with the first antenna structure 210 or the second antenna structure 220.

Figure 2D:
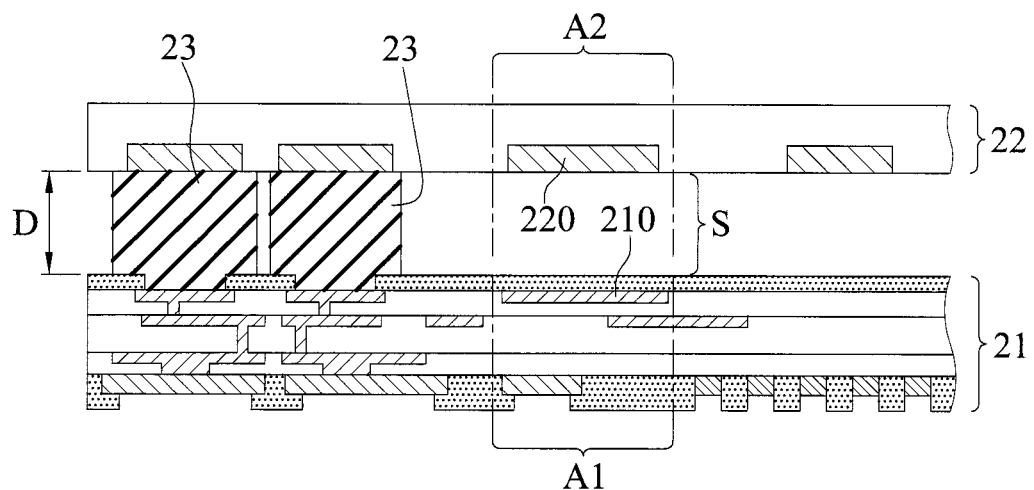
Figure 2D:
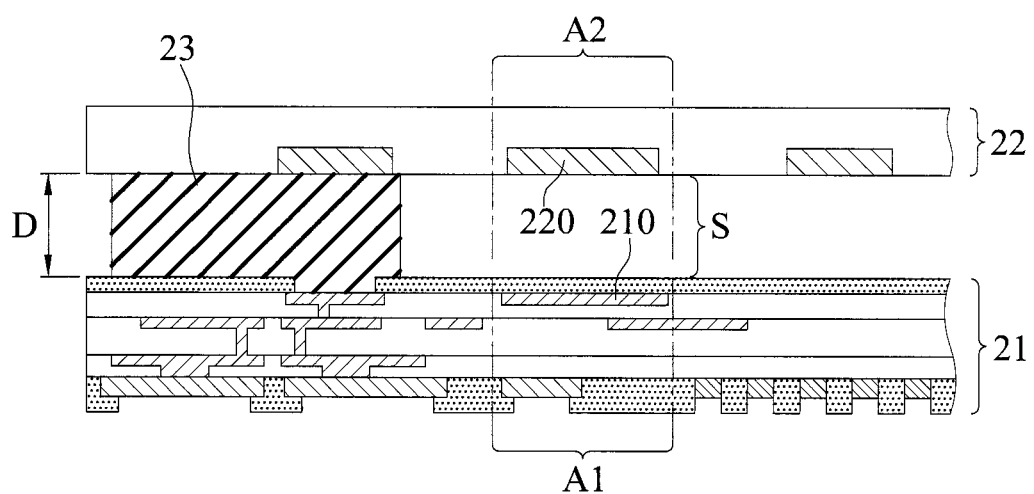
Figure 2E:
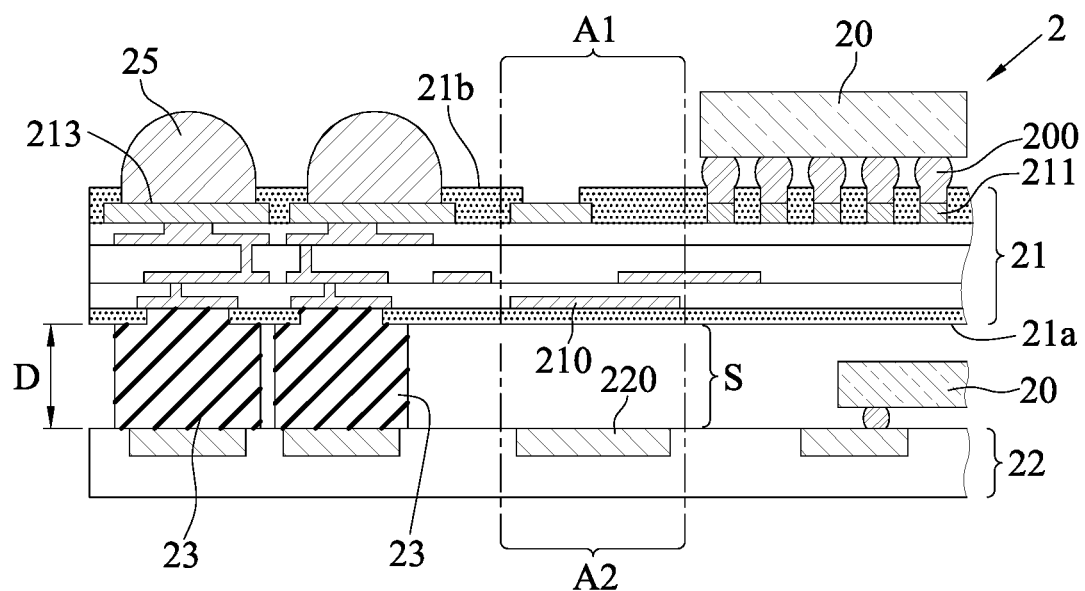
Figure 2E:
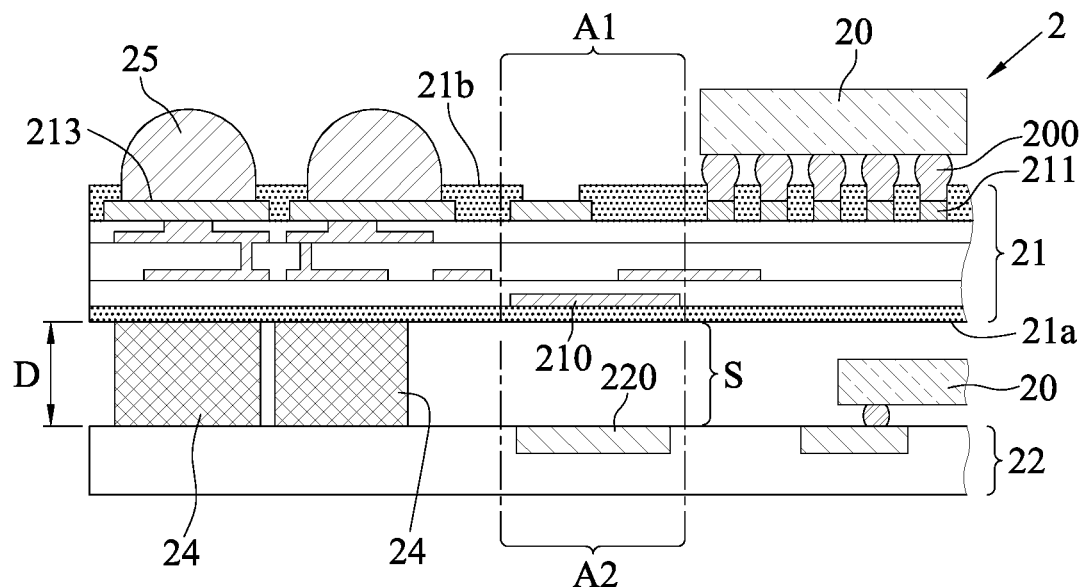

As shown in FIG. 2D, the resist layer 29 is removed by etching, such that the second substrate 22 is stacked on the first substrate 21 by the supports 23 only.

In an embodiment, the supports 23 are located around the antenna active area S, leaving the antenna active area S empty.

In a production layout, a plurality of antenna active areas S are provided as shown in FIG. 2C'. At least one opening 26 can be formed in the second substrate 22, such that an etchant can be poured into the opening 26 to etch away the resist layer 29 between the first substrate 21 and the second substrate 22. In a subsequent singulation process, if needed, the opening 26 can be used as the cutting path to remove the opening 26.

In another embodiment, the supports 23 can be formed on the same unit area of the first substrate 21 with the required quantity. As shown in FIG. 2D', fewer supports 23 are used, and the width of the supports 23 is greater than that of the supports 23 in FIG. 2D.

As shown in FIG. 2E, the first substrate 21 and the second substrate 22 are flipped over, at least one electronic component 20 is provided on the second surface 21b of the first substrate 21, and a plurality of conductive elements 25 (e.g., solder balls) are formed on the ball pads 213, thereby obtaining the electronic package 2. Subsequently, the conductive elements 25 are reflowed for joining with another electronic structure (not shown), such as another circuit board.

In an embodiment, the electronic component 20 can be an active component, a passive component, or a combination thereof, wherein the active component is, for example, a semiconductor chip, and the passive component is, for example, a resistor, a capacitor, and an inductor. In an embodiment, the electronic component 20 is electrically connected with the first circuit layer 211 via a plurality of conductive bumps 200 (e.g., soldering material) in a flip-chip manner. In another embodiment, the electronic component 20 can be electrically connected with the first circuit layer 211 through a plurality of wires by wire bonding. In yet another embodiment, the electronic component 20 can be placed directly on the first circuit layer 211 to electrically connect with the first circuit layer 211. However, the electrical connection between the electronic component 20 and the first substrate 21 is not limited to those described above.

There are many possible arrangements for the electronic component 20 (e.g., provided on the first surface 21a of the first substrate 21, such that the electronic component 20 is disposed between the first substrate 21 and the second substrate 22, and the present disclosure is not limited to those described.

The method for fabricating the electronic package 2 according to the present disclosure includes directly laminating the second substrate 22 on the resist layer 29 to control the distance D between the first substrate 21 and the second substrate 22 (e.g., the height H of the resist layer 29 shown in FIG. 2C), such that the supports 23, 24 are used to stack the second substrate 22 on the first substrate 21 without the need for soldering materials while keeping the distance D between the first substrate 21 and the second substrate 22 substantially constant (the first substrate 21 and the second substrate 22 are not titled). As such, the variations of the distance D can be kept under 10 μm.

Therefore, compared to the prior art, the electronic package 2 according to the present disclosure can precisely control the distance D between the first substrate 21 and the second substrate 22, such that the functions of the first antenna structure 210 and the second antenna structure 220 are not affected by large variation in the distance D, thereby ensuring antenna quality and increasing the product yield.

Figure 3A:
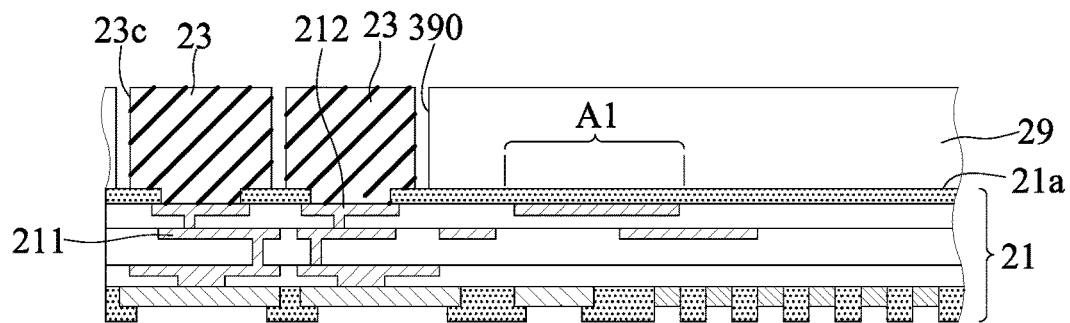
FIGS. 3A to 3C are cross-sectional schematic diagrams depicting a method for fabricating an electronic package in accordance with a second embodiment of the present disclosure.
Figure 3B:
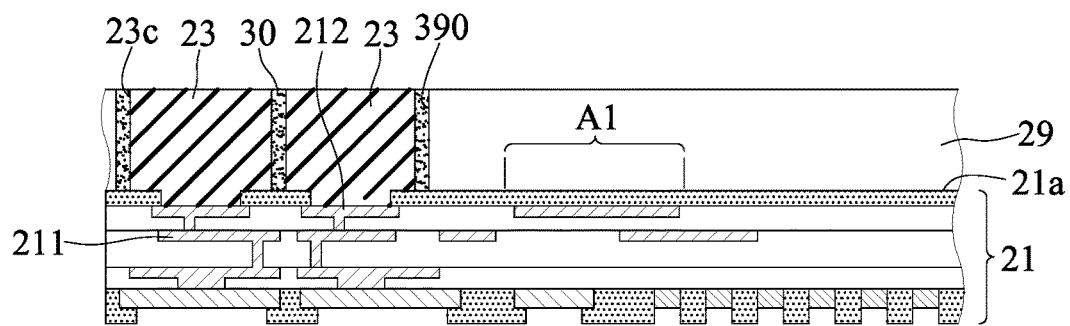
Figure 3C:
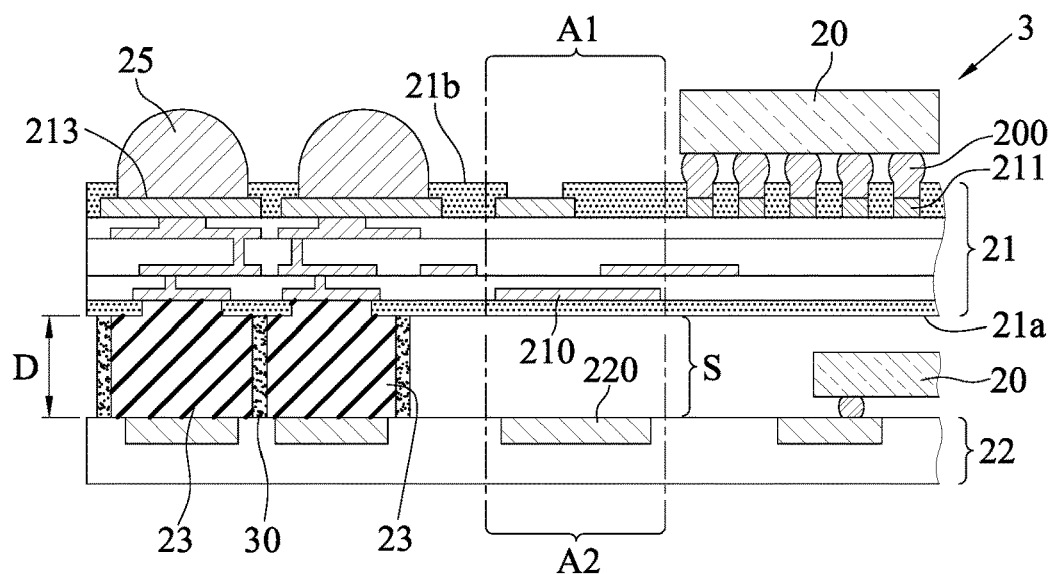

FIGS. 3A to 3C are cross-sectional schematic diagrams depicting a method for fabricating an electronic package 3 in accordance with a second embodiment of the present disclosure. The second embodiment differs from the first embodiment in that a covering material is further formed in the second embodiment.

As shown in FIG. 3A, subsequent to the step in FIG. 2B, after the supports 23 in the openings 290 is formed, the portion of the resist layer 29 adjacent to the supports 23 is removed to form opening regions 390, such that the side faces 23c of the supports 23 are no longer in contact with the resist layer 29.

As shown in FIG. 3B, a covering material 30 is formed in the opening regions 390 to make contact and cover up the side faces 23c of the supports 23. In an embodiment, the covering material 30 is an insulating material.

As shown in FIG. 3C, the second substrate 22 is provided, the resist layer 29 is removed, and the electronic component 20 and the conductive elements 25 are provided according to the steps described with respect to FIGS. 2C to 2E to obtain an electronic package 3 with a covering material 30.

The present disclosure further provides an electronic package 2, 3, which includes: a first substrate 21, a second substrate 22, and at least one support 23, 24.

The first substrate 21 includes a first antenna installation area A1.

The supports 23 are provided on the first substrate 21.

The second substrate 22 is directly laminated on the supports 23, 24, such that the first substrate 21 is stacked on the second substrate 22 via the supports 23, 24, and the second substrate 22 includes a second antenna installation area A2 corresponding to the first antenna installation area A1.

In an embodiment, an antenna active area S is formed between the first antenna installation area A1 and the second antenna installation area A2. In an embodiment, the supports 23, 24 are located around the antenna active area S, leaving the antenna active area S empty.

In an embodiment, the supports 23, 24 are made of a conductive material or an insulating material.

In an embodiment, the supports 23, 24 are not electrically connected with the first antenna installation area A1 and/or the second antenna installation area A2.

In an embodiment, the supports 23, 24 are not electrically connected with the first substrate 21 and/or the second substrate 22.

In an embodiment, the supports 23, 24 are electrically connected with the first substrate 21 and/or the second substrate 22.

In an embodiment, a covering material 30 is formed on side faces 23c of the supports 23 but not in the antenna active area S.

In an embodiment, the electronic package 2 further includes at least one electronic component 20 provided on the first substrate 21. In another embodiment, the electronic component 20 is located between the first substrate 21 and the second substrate 22.

In conclusion, in the electronic package and the method for fabricating the same according the present disclosure, by providing the resist layer and the supports and by laminating the second substrate, the supports and the substrates are joined together without using solder materials to ensure the distance between the first and second substrates meet the requirement. Therefore, the electronic package according to the present disclosure ensures that the antenna transmission of the antenna active area functions properly to guarantee a satisfactory product yield.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
    a first substrate including a first antenna installation area;
    an electronic component provided on the first substrate;
    a support provided on the first substrate;
    a second substrate laminated on the support and stacked on the first substrate via the support, with a distance formed between the first substrate and the second substrate and corresponding to a height of the support, wherein the second substrate includes a second antenna installation area corresponding to the first antenna installation area; and
    an empty space formed between the first antenna installation area and the second antenna installation area and serving as an antenna active area.

2. The electronic package of claim 1, wherein the support is made of a conductive material or an insulating material.

3. The electronic package of claim 1, wherein the support is free from being electrically connected with at least one of the first antenna installation area and the second antenna installation area.

4. The electronic package of claim 1, wherein the support is free from being electrically connected with at least one of the first substrate and the second substrate.

5. The electronic package of claim 1, wherein the support is electrically connected with at least one of the first substrate and the second substrate.

6. The electronic package of claim 1, further comprising a covering material formed on the support.

7. The electronic package of claim 1, wherein the electronic component is located between the first substrate and the second substrate.

* * * * *